(12) United States Patent
Kang et al.

(10) Patent No.: US 7,846,825 B2
(45) Date of Patent: Dec. 7, 2010

(54) METHOD OF FORMING A CONTACT HOLE AND METHOD OF MANUFACTURING A SEMICONDUCTOR DEVICE HAVING THE SAME

(75) Inventors: Nam-Jung Kang, Suwon-si (KR); Jae-Hoon Song, Anyang-si (KR); So-Hyun Ryu, Seoul (KR); Dong-Kwan Yang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/319,406

(22) Filed: Jan. 7, 2009

(65) Prior Publication Data
US 2009/0181529 A1 Jul. 16, 2009

(30) Foreign Application Priority Data
Jan. 11, 2008 (KR) .................. 10-2008-0003506

(51) Int. Cl.
*H01L 21/3205* (2006.01)
*H01L 21/4763* (2006.01)

(52) U.S. Cl. .............. 438/586; 438/637; 438/671; 438/717; 438/736; 438/950; 257/E21.158; 257/E21.495; 257/E21.597

(58) Field of Classification Search ............. 438/671, 438/717, 737, 738, 950, 586, 637, 736; 257/E21.597, 257/E21.158, E21.495
See application file for complete search history.

(56) References Cited

U.S. PATENT DOCUMENTS

| 5,851,856 | A   | * | 12/1998 | Nagura .................. 438/130 |
| 5,920,790 | A   | * | 7/1999  | Wetzel et al. ............ 438/618 |
| 6,204,161 | B1  | * | 3/2001  | Chung et al. ............. 438/612 |
| 6,787,875 | B2  | * | 9/2004  | Brennan et al. .......... 257/508 |
| 7,253,099 | B2  |   | 8/2007  | Hwang et al. |
| 7,462,566 | B2  | * | 12/2008 | Fujita et al. ............. 438/736 |
| 7,776,750 | B2  | * | 8/2010  | Kim ...................... 438/703 |
| 2004/0166667 | A1 | * | 8/2004 | Lee ...................... 438/637 |
| 2005/0101127 | A1 |   | 5/2005 | Hwang et al. |
| 2005/0230734 | A1 | * | 10/2005 | Ha et al. ................. 257/306 |
| 2007/0246803 | A1 | * | 10/2007 | Haller ................... 257/640 |
| 2008/0093710 | A1 | * | 4/2008  | Bach ..................... 257/635 |

FOREIGN PATENT DOCUMENTS

| KR | 10-2005-0064248 | 6/2005 |
| KR | 10-0546393      | 1/2006 |
| KR | 10-0600288      | 7/2006 |

* cited by examiner

*Primary Examiner*—Charles D Garber
*Assistant Examiner*—Angel Roman
(74) *Attorney, Agent, or Firm*—Mills & Onello, LLP

(57) ABSTRACT

In a method of forming a contact hole and a method of manufacturing a semiconductor device having the same, a first insulation interlayer is formed on a substrate. A dummy pattern is formed on the first insulation interlayer. A second insulation interlayer is formed to cover the dummy pattern. A photoresist pattern is formed on the second insulation interlayer. The photoresist pattern has an exposed portion. The dummy pattern under the photoresist pattern is arranged to cross over the exposed portion of the photoresist pattern. The first and second insulation interlayers are etched using the photoresist pattern and the dummy pattern as an etching mask, to form a plurality of contact holes on both sides of the dummy pattern. Accordingly, the contact holes may be formed to have a smaller width.

22 Claims, 17 Drawing Sheets

METHOD OF FORMING A CONTACT HOLE AND METHOD OF MANUFACTURING A SEMICONDUCTOR DEVICE HAVING THE SAME

CROSS REFERENCE TO RELATED APPLICATIONS

This application claims priority under 35 U.S.C. §119 to Korean Patent Application No. 10-2008-0003506, filed on Jan. 11, 2008 in the Korean Intellectual Property Office (KIPO), the contents of which are herein incorporated by reference in their entirety.

FIELD OF INVENTION

The present invention relates to a method of forming a contact hole, and a method of manufacturing a semiconductor device having the same. More particularly, aspects of the present invention relate to a method of forming a contact hole having a relatively small size, and a method of manufacturing a semiconductor device having the same.

BACKGROUND

Semiconductor memory devices may be divided into volatile memory devices, e.g., dynamic random access memory (DRAM) or static random access memory (SRAM), and non-volatile memory devices, e.g., flash memory devices. The degrees of integration, operating speeds, and capacitances of the semiconductor memory devices have been greatly improved due to expanding application thereof.

As the degree of integration of a semiconductor memory device is increased, a finer pattern or a smaller contact size may need to be formed and, thus, a photolithography process for forming the finer pattern or the smaller contact size may be faced with limits of resolution. Accordingly, a process of forming a contact included in the semiconductor memory device may include a self-aligned contact process where a contact hole is formed using an etch selectivity difference between an insulation interlayer and element structures, e.g., bit line structures and word line structures.

On the other hand, recently, research has been carried out on a word line having a buried gate structure where a gate electrode is buried under an upper surface of a substrate. Because the buried gate electrode is completely buried within a recess portion that is formed in the substrate, a patterning process for forming the gate electrode may not be required. Therefore, the gate electrode may be easily formed using metal material. Further, a spacer is not formed on sidewalls of the gate electrode, to thereby increase a contact area formed on both sides of the gate electrode.

In a formation of a cell of the memory device, if the buried electrode is used for a gate that is provided as a word line, because the gate electrode does not protrude from the surface of the substrate, the self-aligned contact process may not be performed. Thus, when a photo-misalignment occurs in a photolithography process, the contact may not be formed to be precisely aligned.

When the buried gate electrode is used to manufacture a DRAM device, it may be difficult to form pad contacts that are respectively connected to a bit line contact and a storage node contact on source/drain regions on both sides of the gate electrode, because the self-aligned contact process is not performed. Therefore, when the buried gate electrode is used, the bit line contact and the storage node contact may be formed to extend directly to the active substrate without using the pad contacts.

When the bit line contact and the storage node contact are formed without the pad contacts, the height of each of the contacts is greatly increased. Therefore, a not-open failure that a contact portion of the substrate is not exposed by the contact hole in an etch process for forming the contacts may occur frequently. Further, in a process for forming the storage node contact, a time of an etch process for forming the contact may be greatly increased. Accordingly, a sidewall spacer of the previously formed bit line structure may be excessively etched to cause a short failure between the bit line and the storage node contact.

SUMMARY

According to aspects of the invention, there is provided a method of precisely forming contact holes having a relatively narrow width on a desired contact region. The method may include precisely forming the pad contact without using the self-aligned contact process. Further, the method may include forming a pad contact having a width smaller than that of an exposed portion of a photoresist pattern that is formed by a photolithography process.

Also according to aspects of the invention, there is provided a method of manufacturing a semiconductor device including the contact holes.

According to one aspect of the invention, provided is a method of forming a contact hole, including forming a first insulation interlayer on a substrate. A dummy pattern is formed on the first insulation interlayer. A second insulation interlayer is formed to cover the dummy pattern. A photoresist pattern is formed on the second insulation interlayer. The photoresist pattern has at least one exposed portion. The dummy pattern under the photoresist pattern is arranged to cross over the at least one exposed portion of the photoresist pattern. The first and second insulation interlayers are etched using the photoresist pattern and the dummy pattern as an etching mask, to form a plurality of contact holes on both sides of the dummy pattern.

The dummy pattern may have a linear shape extending in a first direction.

The exposed portion of the photoresist pattern may have an isolated shape, and a longitudinal direction of the exposed portion may be different from a direction in which the dummy pattern extends.

A plurality of the dummy patterns may be provided on the substrate and the dummy patterns may be arranged to be parallel with one another.

Dummy patterns from the plurality of the dummy patterns may be arranged in the exposed portions of the photoresist pattern.

The at least one exposed portion of the photoresist pattern may include a plurality of exposed portions repeatedly arranged.

To form the dummy pattern, a dummy layer having an etch selectivity with respect to the first and the second insulation interlayers may be formed. The dummy layer may then be patterned.

In the alternative, to form the dummy pattern, the first insulation interlayer may be partially etched to form a trench. A dummy layer may be formed to fill the trench. The dummy layer may be planarized to form the dummy pattern in the trench.

In still another alternative, to form the dummy pattern, an insulation layer pattern may be formed on the first insulation interlayer. A dummy layer may be formed on surfaces of the insulation layer pattern and the first insulation interlayer, the dummy layer having an etch selectivity with respect to the first and the second insulation interlayers. The dummy layer may be anisotropically etched to form the dummy pattern having a spacer shape on both sides of the insulation layer pattern.

According to another aspect of the invention, provided is a method of manufacturing a semiconductor device, wherein buried gate electrodes having contact-forming regions in surfaces of a substrate on both sides of the buried gate electrode are formed. The buried gate electrode is buried in the substrate. A first insulation interlayer is formed on the substrate. A dummy pattern is formed on the first insulation interlayer. The dummy pattern is arranged to correspond to a portion between the contact-forming regions. A second insulation interlayer is formed to cover the dummy pattern. A photoresist pattern is formed on the second insulation interlayer. The photoresist pattern has an exposed portion to expose the contact-forming regions. The dummy pattern under the photoresist pattern is arranged to cross over the exposed portion of the photoresist pattern. The first and second insulation interlayers are etched using the photoresist pattern and the dummy pattern as an etching mask, to form contact holes. The contact holes are filled with conductive material to form pad contacts.

The method may further include forming planar gate electrodes in a region of the substrate.

An upper surface of the first insulation interlayer may be in the same plane as an upper surface of the planar gate electrode, or the upper surface of the first insulation interlayer may have a height greater than that of the upper surface of the planar gate electrode.

To form the pad contacts, a conductive layer may be deposited to fill the contact holes. The conductive layer may be planarized until the dummy pattern is removed, to form the pad contact in each of the contact holes.

The dummy pattern may be arranged to cover at least two buried gate electrodes.

The contact-forming region may include storage node contact regions on both sides of the buried gate electrode, and the pad contact may include a storage node pad contact.

The dummy pattern may be arranged to cover one of the buried gate electrodes.

The contact-forming region may include a storage node contact region and a bit line node contact region on both sides of the buried gate electrode, and the pad contact may include a storage node pad contact and a bit line pad contact.

The method may further include etching an isolation region of the substrate to form an isolation trench to define an active region, and forming an isolation pattern in the isolation trench.

The exposed portion of the photoresist pattern may be formed to have substantially the same shape as the active region where the buried electrode is formed.

To form the dummy pattern, a dummy layer having an etch selectivity with respect to the first and the second insulation interlayers may be formed. The dummy layer may then be patterned.

In the alternative, to form the dummy pattern, the first insulation interlayer may be partially etched to form a trench. A dummy layer may be formed to fill the trench. The dummy layer may be patterned to form the dummy pattern in the trench.

In still another alternative, to form the dummy pattern, an insulation layer pattern may be formed on the first insulation interlayer. A dummy layer may be formed on surfaces of the insulation layer pattern and the first insulation interlayer, the dummy layer having an etch selectivity with respect to the first and the second insulation interlayers. The dummy layer to form the dummy pattern having a spacer shape on both sides of the insulation layer pattern.

The method may further include adhering an external connection terminal to a surface of the substrate opposite to a surface where the semiconductor chips are adhered.

According to some aspects of the invention, contact holes may be formed to have a width smaller than that of a photoresist pattern formed by a photolithography process. Accordingly, the contact holes may be formed to have a width smaller than the critical width of the photoresist pattern formed by a photolithography process. Further, a contact plug may be precisely formed on a desired contact region without performing the self-aligned contact process.

BRIEF DESCRIPTION OF THE DRAWINGS

Aspects of the present invention will be more clearly understood from the following detailed description of example embodiments taken in conjunction with the accompanying drawings thereof.

DETAILED DESCRIPTION OF THE EMBODIMENTS

Figure 1:
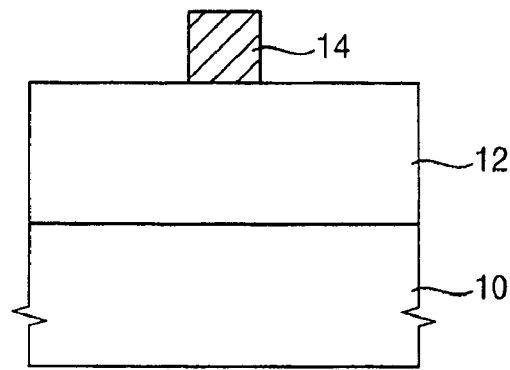
FIGS. 1 to 4 are cross-sectional views illustrating an example embodiment of a method of forming a contact plug in accordance with a first aspect of the invention.

Various aspects of the invention will be discussed hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Embodiment I

FIGS. 1 to 4 are cross-sectional views illustrating an example embodiment of a method of forming a contact plug in accordance with a first aspect of the invention.

Referring FIG. 1, a first insulation interlayer 12 is formed on a substrate 10 including a semiconductor material, such as single-crystalline silicon. The first insulating interlayer 12 may be formed using silicon oxide by a chemical vapor deposition (CVD) process. A plurality of contact-forming regions is defined on the substrate 10.

A dummy layer (not illustrated) is formed on the first insulation interlayer 12. The dummy layer may be formed using a material having an etch selectivity with respect to the first insulation interlayer 12. When the first insulation interlayer 12 includes silicon oxide, the dummy layer may include silicon nitride or polysilicon.

A photoresist film is coated on the dummy layer, and then exposure and development processes are performed on the photoresist film to form a first photoresist pattern (not illustrated). Then, the dummy layer is etched using the first photoresist pattern as an etching mask to form a dummy pattern 14.

The dummy pattern 14 is formed to cover the substrate between adjacent contact-forming regions. Accordingly, the dummy pattern 14 may serve as a hard mask for masking the first insulation interlayer 12 between contact holes to be formed by a process described below. The dummy pattern 14 may have a linear shape extending in a first direction.

Then, the first photoresist pattern is removed by ashing and stripping processes.

Figure 2:
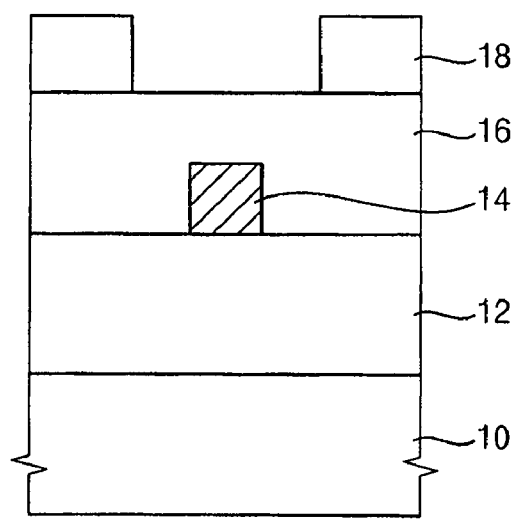

Referring to FIG. 2, a second insulation interlayer 16 is formed to sufficiently cover the dummy pattern 14. The second insulation interlayer 16 may be formed using silicon oxide through a CVD process.

Then, a planarization process is performed on the second insulation interlayer 16 to planarize an upper surface of the second insulation interlayer 16. The planarization process may include a chemical mechanical polishing (CMP) process. Although not illustrated in the figures, the planarization process may be performed on the second insulation interlayer 16 until an upper surface of the dummy pattern 14 is exposed.

A second photoresist pattern 18 is formed on the second insulation interlayer 16. The second photoresist pattern 18 has an exposed portion corresponding to at least a portion of the upper surface of the dummy pattern 14. A second photoresist pattern 18 is formed on the second insulation interlayer 16. The exposed portion of the second photoresist pattern 18 may have an isolated shape, i.e., a shape where at least two portions of the second photoresist pattern are not directly adjacent. The dummy pattern 14 under the second photoresist pattern 18 may be arranged to cross over the middle of the exposed portion of the second photoresist pattern. The exposed portion of the second photoresist pattern 18 may be divided into two parts by the dummy pattern 14 formed under the second photoresist pattern 18.

A longitudinal direction of the exposed portion of the second photoresist pattern 18 may be different from a direction in which the dummy pattern 14 extends. The longitudinal direction of the exposed portion of the second photoresist pattern 18 may be inclined by a predetermined angle with respect to the direction in which the dummy pattern 14 extends.

Figure 3:
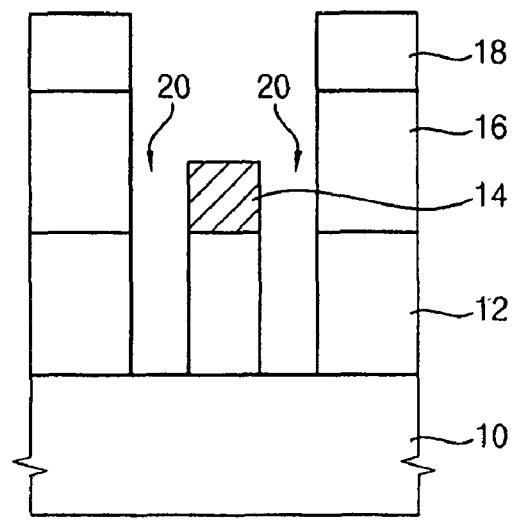

Referring to FIG. 3, the second insulation interlayer 16 is anisotropically etched using the second photoresist pattern 18 as an etching mask, and then the first insulation interlayer 12 is anisotropically etched.

In the anisotropic etching process, first, the second insulation interlayer 16 exposed by the second photoresist pattern 18 is etched. After the dummy pattern 14 is etched, the second insulation interlayer 16 and the first insulation interlayer 12 on both sides of the dummy pattern 14 that are exposed by the exposed portion of the second photoresist pattern 18 are etched. Accordingly, two separate contact holes 20 are formed on both sides of the dummy pattern 14.

As mentioned above, two separate contact holes 20 may be formed using the photoresist pattern having one isolated exposed portion. The contact hole 20 may be formed to have a width smaller than that of the exposed portion of the photoresist pattern.

Figure 4:
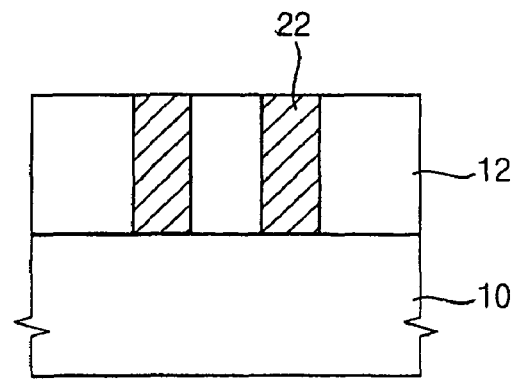

Referring to FIG. 4, the second photoresist pattern 18 is removed from the substrate 10 by ashing and stripping processes.

A conductive layer (not illustrated) is deposited to fill the contact holes 20. The conductive layer and the dummy pattern 14 is planarized until the upper surface of the first insulation interlayer 12 is exposed, to form contact plugs 22.

In another example embodiment, although not illustrated in the figures, the conductive layer may be planarized until the upper surface of the dummy pattern 14 is exposed, so that the dummy pattern remains between the contact plugs.

Embodiment II

Figure 5:
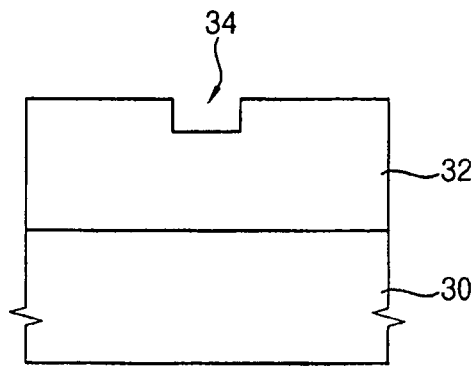
FIGS. 5 to 7 are cross-sectional views illustrating another example embodiment of a method of forming a contact plug in accordance with a second aspect of the invention.
Figure 6:
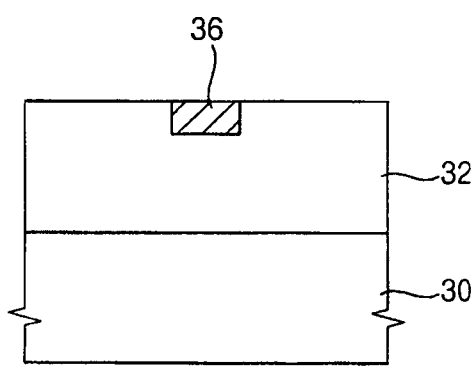
Figure 7:
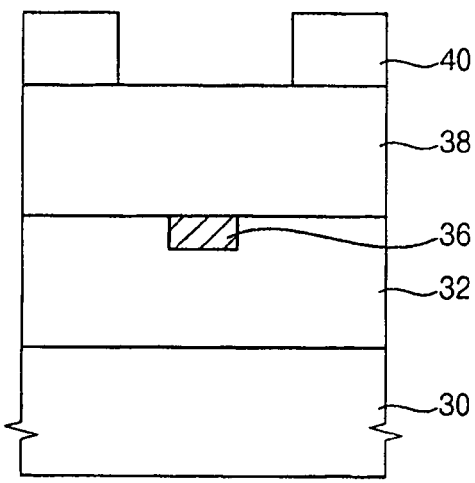

FIGS. 5 to 7 are cross-sectional views illustrating an example embodiment of a method of forming a contact plug in accordance with a second aspect of the invention. The method of forming a contact plug of the present embodiment is substantially the same as that of Embodiment I except for a process of forming the dummy pattern.

Referring to FIG. 5, a first insulation interlayer 32 is formed on a substrate 30 including a semiconductor material such as single-crystalline silicon. The first insulation interlayer 32 may be formed using silicon oxide through a CVD process. A plurality of contact-forming regions is defined on the substrate 30.

A first photoresist pattern (not illustrated) is formed on the first insulation interlayer 32. The first insulation interlayer 32 is partially etched using the first photoresist pattern as an etching mask to form a trench 34 for forming a dummy pattern. The trench 34 may be positioned between the adjacent contact-forming regions. The trench 34 may extend in a first direction.

Referring to FIG. 6, a dummy layer (not illustrated) is formed to fill the trench 34. The dummy layer may include a material having an etch selectivity with respect to the first insulation interlayer 32.

The dummy layer is planarized until an upper surface of the first insulation interlayer 32 is exposed, to form a dummy pattern 36 in the trench 34. The dummy layer may be formed by a CMP process, for example.

Referring to FIG. 7, a second insulation interlayer 38 is formed on the first insulation interlayer 32 and the dummy pattern 36. The second insulation interlayer 38 may be formed using silicon oxide through a CVD process.

In this embodiment, because an upper surface of the first insulation interlayer 32 has substantially the same height as that of the dummy pattern 36, a process for planarizing an upper surface of the second insulation interlayer 38 may be omitted.

A second photoresist pattern 40 is formed on the second insulation interlayer 3. The second photoresist pattern 40 has an exposed portion facing at least a portion of an upper surface of the dummy pattern 36. The exposed portion of the second photoresist pattern 40 may have an isolated shape. The dummy pattern 36 under the second photoresist pattern 40 may be arranged to cross over the middle of the exposed portion of the second photoresist pattern. The arrangement of the exposed portion of the second photoresist pattern 40 may be substantially the same as that of Embodiment I and any further repetitive explanation will be omitted.

Then, as illustrated in the figures, the second and first insulation interlayers 38 and 32 are anisotropically etched using the second photoresist pattern 40 and the dummy pattern 36 under the second photoresist pattern 40 as etching masks, to form substantially the same contact holes as those illustrated in FIG. 3. Additionally, a conductive layer is deposited to fill the contact holes and the conductive layer is planarized to form substantially the same contact plugs as those illustrated in FIG. 4.

Embodiment III

FIGS. 8 to 12 are cross-sectional views illustrating an embodiment of a method of forming a contact plug in accordance with a third aspect of the invention.

Figure 8:
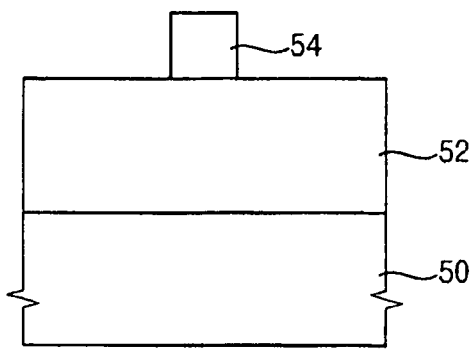
FIGS. 8 to 12 are cross-sectional views illustrating another example embodiment of a method of forming a contact plug in accordance with a third aspect of the invention.

Referring to FIG. 8, after a first insulation interlayer 52 is formed on a substrate 50 including a semiconductor material, such as single-crystalline silicon. The first insulating interlayer 52 may be formed using silicon oxide through a CVD process. A plurality of contact-forming regions is defined on the substrate 50.

An insulation layer (not illustrated) is formed on the first insulation interlayer 52. The insulation layer may include the same material as the first insulation interlayer 52. A first photoresist pattern (not illustrated) is formed on the insulation layer by a photolithography process, and then the insulation layer is etched using the first photoresist pattern as an etching mask to form an insulation layer pattern 54. The insulation layer pattern 54 may be formed to mask the middle contact-forming region of three contact-forming regions adjacent to one another. That is, by a following process, one contact plug may be formed corresponding to a region where the insulation layer pattern 54 is formed. The insulation layer pattern 54 may have a linear shape extending in a first direction.

Figure 9:
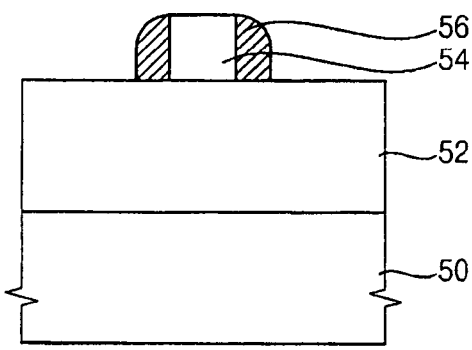

Referring to FIG. 9, a dummy layer (not illustrated) is formed along surfaces of the insulation layer pattern 54 and the first insulation interlayer 52. The dummy layer may include a material having an etch selectivity with respect to the insulation layer pattern 54 and the first insulation interlayer 52. The dummy layer may have a thickness substantially the same as a width between the adjacent contact-forming regions.

The dummy layer is anisotropically etched to form a spacer-shaped dummy pattern 56 on sidewalls of the insulation layer pattern 54. When the insulation layer pattern 54 has a linear shape, two dummy patterns 56 having linear shapes parallel with each other may be formed on both sides of the insulation layer pattern 54. The dummy patterns 56 may mask regions between the adjacent three contact-forming regions.

Figure 10:
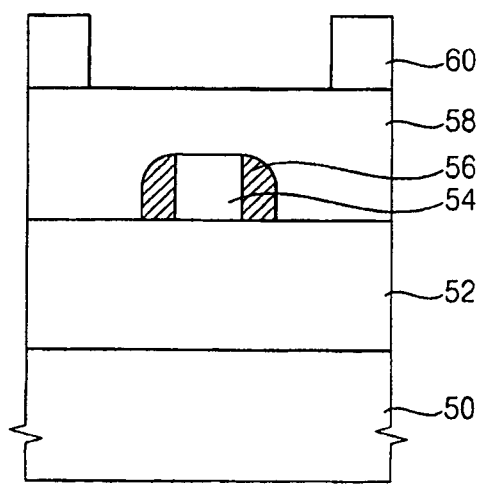

Referring to FIG. 10, a second insulation interlayer 58 is formed to sufficiently cover the dummy patterns 56. The second insulation interlayer 58 may be formed using silicon oxide through a CVD process.

A planarization process is performed on the second insulation interlayer 58 to planarize an upper surface of the second insulation interlayer 58. Although not illustrated in the figures, the second insulation interlayer 58 may be planarized until an upper surface of the dummy pattern 56 is exposed.

A second photoresist pattern 60 is formed on the second insulation interlayer 58 to partially expose at least portions of the dummy patterns 56. An exposed portion of the second photoresist pattern 60 may have an isolated shape, i.e., a shape where at least two portions are not directly adjacent. Two parallel dummy patterns 56 under the second photoresist pattern 60 may be arranged to cross over the exposed portion of the second photoresist pattern 60. The exposed portion of the second photoresist pattern 60 may be divided into three parts by the dummy pattern 56 formed under the second photoresist pattern 60.

Figure 11:
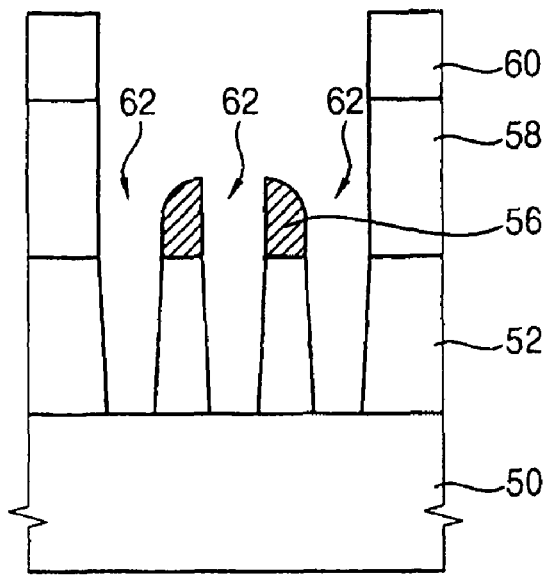

Referring to FIG. 11, the second insulation interlayer 58 exposed by the second photoresist pattern 60 is anisotropically etched using the second photoresist pattern 60 as an etching mask, and then the second insulation interlayer 58, the first insulation interlayer 52 and the insulation layer pattern 54 on both sides of the dummy pattern 56 and between the dummy patterns 56 are anisotropically etched. Accordingly, three separate contact holes 62 are formed on both sides of the dummy pattern 56 and between the dummy patterns 56.

As mentioned above, three separate contact holes may be formed using the photoresist pattern having one isolated exposed portion. The contact hole may be formed to have a width smaller than that of the exposed portion of the photoresist pattern.

Figure 12:
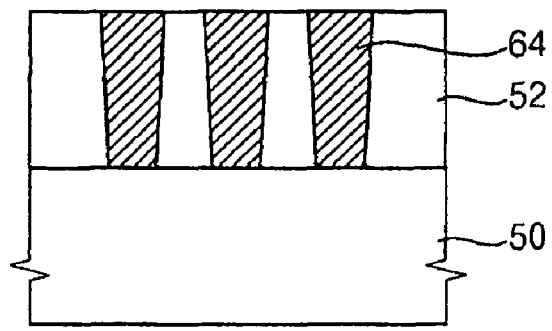

Referring to FIG. 12, the second photoresist pattern 60 is removed from the substrate 10 by ashing and stripping processes.

A conductive layer (not illustrated) is deposited to fill the contact holes 62. The conductive layer are planarized until the upper surface of the first insulation interlayer 52 is exposed, to form contact plugs 64 in the contact holes.

In another example embodiment, although not illustrated in the figures, the conductive layer may be planarized until the upper surface of the dummy pattern is exposed, so that the dummy pattern remains between the contact plugs.

Embodiment IV

FIGS. 13 to 20 are cross-sectional views illustrating an example embodiment of a method of manufacturing a DRAM device in accordance with a fourth aspect of the invention.

Figure 13:
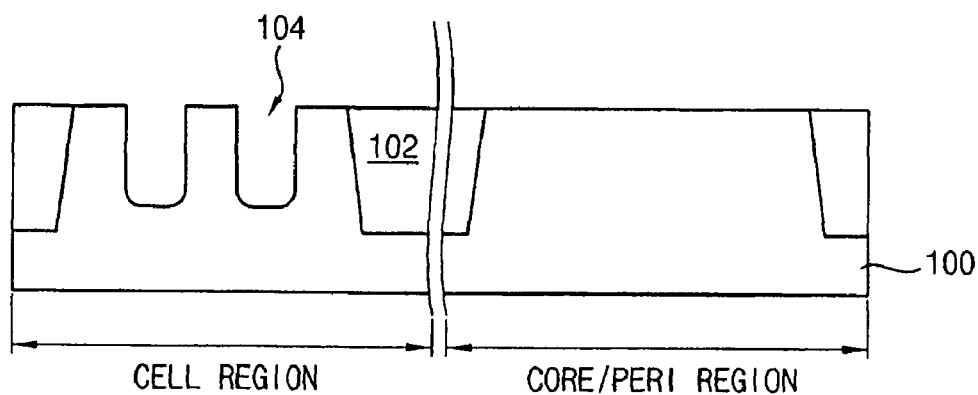
FIGS. 13 to 20 are cross-sectional views illustrating another example embodiment of a method of manufacturing a dynamic random access memory (DRAM) device in accordance with a fourth aspect of the invention.

Referring to FIG. 13, a substrate 100 including a semiconductor material such as single-crystalline silicon is prepared. The substrate 100 may be divided into a cell region and a core/peripheral region. Cells of the DRAM device may be formed in the cell region and peripheral circuits for driving the cells may be formed in the core/peripheral region.

A pad oxide layer (not illustrated) and a hard mask layer (not illustrated) are formed on the substrate 100, and then are etched by a photolithography process to form a pad oxide layer pattern (not illustrated) and a first hard mask pattern (not illustrated). The substrate 100 is etched using the first hard mask pattern as an etching mask to form an isolation trench. The isolation trench is filled with an insulation material such as silicon oxide and is planarized to form an isolation pattern 102. An active region and an isolation region may be defined on the substrate 100 by the isolation pattern 102. Then, the first hard mask pattern is removed from the substrate 100.

In this embodiment, the active regions in the cell region may have isolated shapes that are repeatedly arranged.

A mask pattern (not illustrated) is formed on the cell region of the substrate to selectively expose portions where a cell gate electrode for a word line is formed. The mask pattern may be a photoresist pattern or a hard mask pattern.

The substrate and the isolation pattern in the cell region are partially etched using the mask pattern as an etching mask to form a recess portion 104 for forming a buried gate electrode. Then, the mask pattern is removed from the substrate 100.

Figure 14:
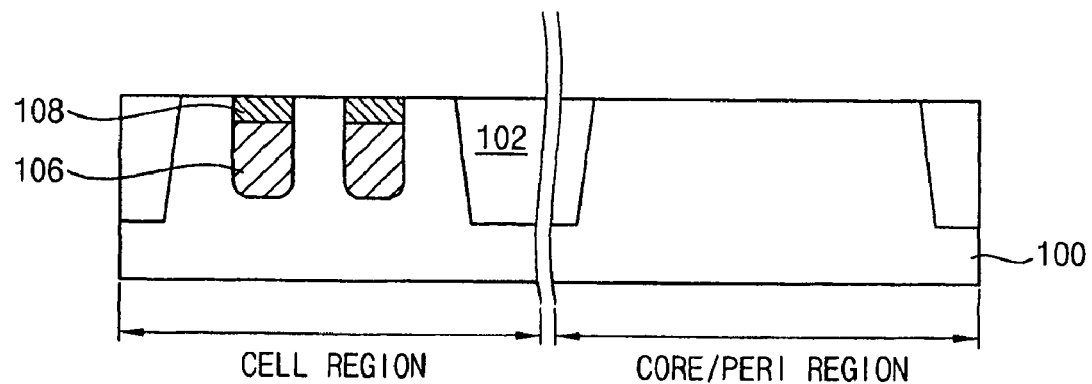

Referring to FIG. 14, a gate insulation layer (not illustrated) is formed on an inner surface of the recess portion 104. For example, the inner surface of the recess portion 104 may be thermally oxidized to form the gate insulation layer.

A buried gate electrode 106 is formed on the gate insulation layer to partially fill the recess portion 104. The buried gate electrode 106 may have a linear shape extending in a first direction to be provided as the word line.

The buried gate electrode 106 may include a semiconductor material, such as doped polysilicon or metal. A capping layer pattern 108 is formed on the buried gate electrode 106 to completely fill the recess portion 104. The capping layer pattern 108 may include silicon oxide or silicon nitride.

Figure 21:
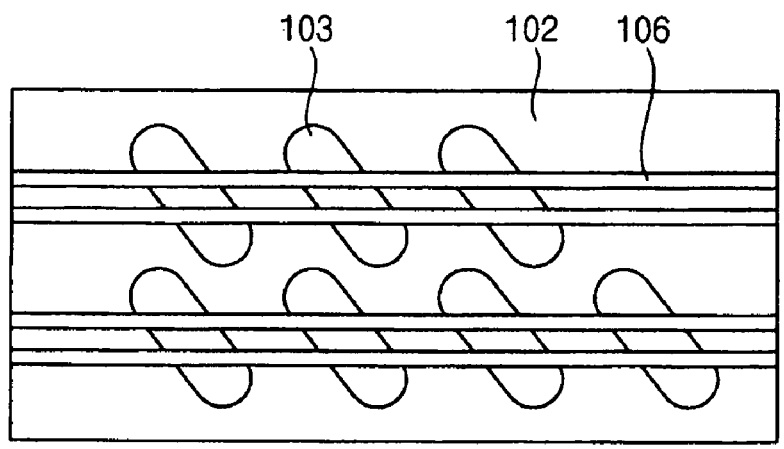
FIG. 21 is a plan view illustrating an example embodiment of a buried gate electrode formed in a cell region.

FIG. 21 is a plan view illustrating an embodiment of a buried gate electrode formed in a cell region.

By performing the above-mentioned processes, as illustrated in FIG. 21, the buried gate electrodes 106 provided as the word lines are formed in the cell region of the substrate. The buried electrodes 106 formed in the cell region of the substrate do not protrude from the surface of the substrate, in this embodiment. In another embodiment, the buried electrode 106 may not be formed in the core/peripheral region of the substrate. As illustrated in FIG. 21, the reference number 103 is referred to as the active region.

Figure 15:
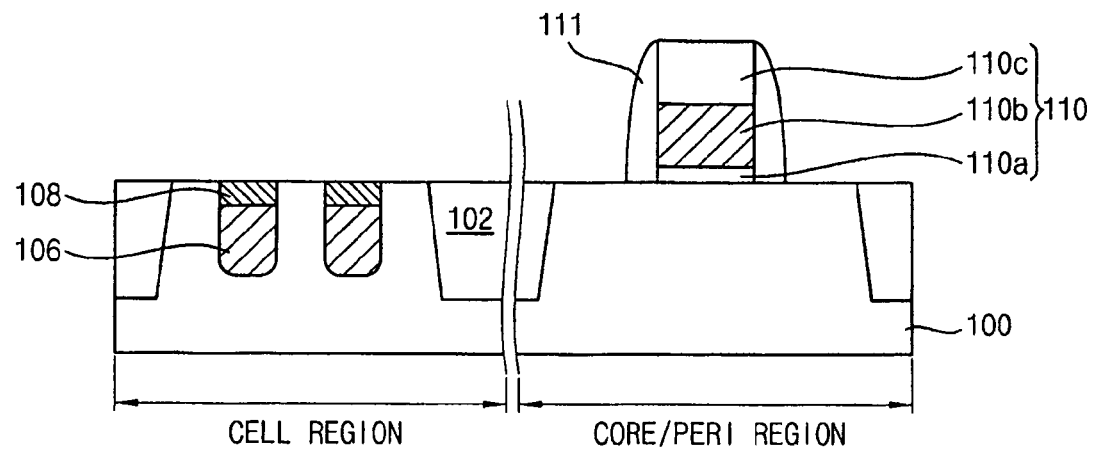

Referring to FIG. 15, a planar gate electrode 110 is selectively formed in the core/peripheral region of the substrate 100. The planar gate electrode 110 in the core/peripheral region may have a shape protruding from the surface of the substrate.

A gate insulation layer (not shown) is formed on the substrate 100 and a gate conductive layer (not shown) is formed on the gate insulation layer. A second hard mask pattern 110c is formed on the gate conductive layer. The second hard mask pattern 110c may be provided as a mask for patterning a gate electrode to be formed in the core/peripheral region. Then, the gate conductive layer and the gate insulation layer are etched using the second hard mask pattern 110c as an etching mask to form a gate electrode 110b and a gate insulation layer pattern 110a in the core/peripheral region of the substrate. A spacer 111 is formed on sidewalls of the planar gate electrode 110, including the gate insulation pattern 110a, the gate electrode 110b and the second hard mask pattern 110c.

Then, although not illustrated in the figures, impurities are implanted beneath the upper surface of the substrate 100 on both sides of the buried gate electrode 106 in the cell region and beneath the surface of the substrate 100 on both sides of the planar gate electrode 110 in the core/peripheral region, to form source/drain regions. In this embodiment, surfaces of the drain regions on both sides of the buried gate electrode 106 in the cell region may correspond to storage node contact-forming regions.

Figure 16:
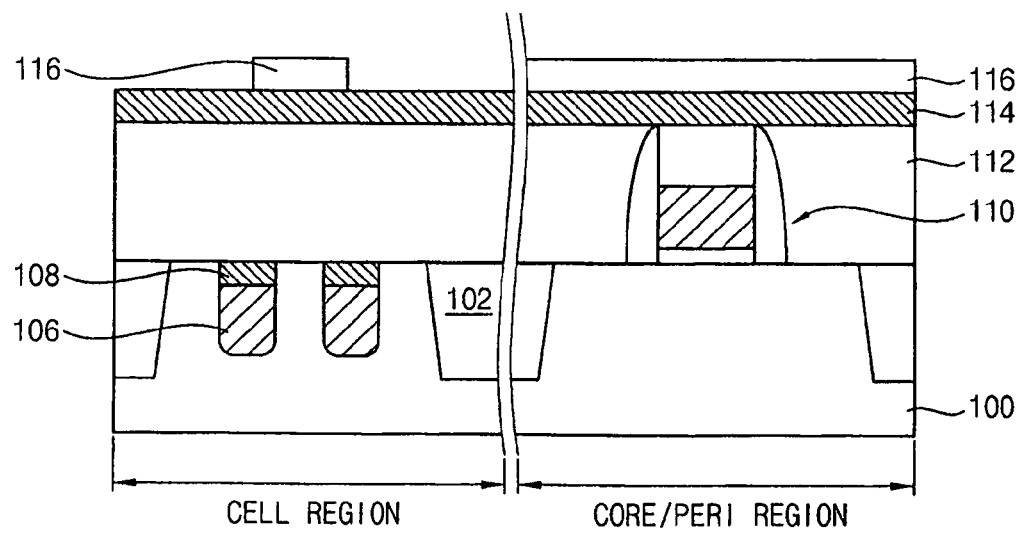

Referring to FIG. 16, a first insulation interlayer 112 is formed on the substrate including the planar gate electrode 110 formed thereon. The first insulation interlayer 112 may be formed using silicon oxide through a CVD process. After forming the first insulation interlayer 112, the first insulation interlayer 112 may be further planarized to have a substantially even upper surface thereof.

As illustrated in FIG. 16, the upper surface of the first insulation interlayer 112 may be planarized until the second hard mask pattern 110c of the planar gate electrode 110 is exposed. Although not illustrated in the figures, an insulation layer may be further formed on the planarized first insulation inter layer 112 to cover the upper surface of the second hard mask pattern 110c.

In another example embodiment, the upper surface of the first insulation interlayer 112 may be planarized so that the first insulation interlayer 112 remains on the second hard mask pattern 110c.

A dummy layer 114 is formed on the first insulation interlayer 112. The dummy layer 114 may include a material having an etch selectivity with respect to the first insulation interlayer 112. For example, the dummy layer 114 may be formed using silicon nitride, polysilicon, etc.

A photoresist film is coated on the dummy layer 114, and then exposure and development processes are performed on the photoresist film to form a first photoresist pattern 116.

As illustrated in FIG. 16, the first photoresist pattern 116 may mask a portion of the dummy layer 114 between contact holes to be formed in the cell region. In this embodiment, the first photoresist pattern 116 may be positioned to mask a portion between the storage node contact regions. The first photoresist pattern 116 may have a linear shape extending in the first direction where the buried gate electrode 106 extends. The first photoresist pattern 116 may be formed to cover the entire dummy layer 114 positioned in the core/peripheral region.

Alternatively, although not illustrated in the figures, the first photoresist pattern 116 may not be formed in the core/peripheral region so that the dummy layer 114 in the core/peripheral region is exposed.

Figure 17:
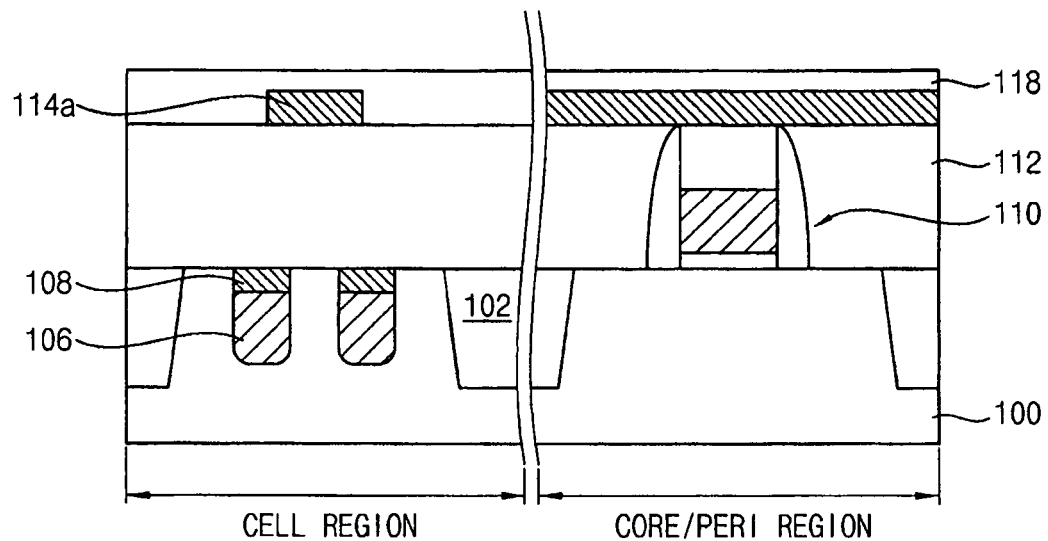

Referring to FIG. 17, the dummy layer 114 is etched using the first photoresist pattern 116 as an etching mask to form a dummy pattern 114a on the first insulation interlayer 112.

Alternatively, although not illustrated in FIG. 17, when the first photoresist pattern 116 is not in the core/peripheral region in the previous process, the dummy pattern 114a may not be formed in the core/peripheral region.

Figure 22:
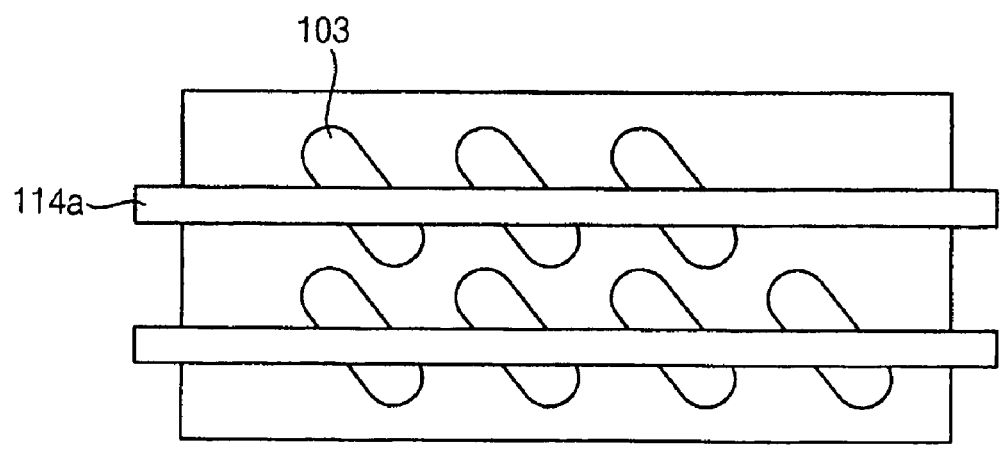
FIG. 22 is a plan view illustrating an example embodiment of a dummy pattern formed in a cell region.

FIG. 22 is a plan view illustrating a dummy pattern formed in a cell region.

Referring to FIG. 22, the dummy pattern 114a has a linear shape extending in the first direction to mask the portion between the storage node contact regions. The one dummy pattern 114a covers two buried gate electrodes parallel with each other.

After forming the dummy pattern 114a, the first photoresist pattern is removed from the substrate 100 by ashing and stripping processes.

A second insulation interlayer 118 is formed to cover the first insulation interlayer 112 and the dummy pattern 114a. Then, a planarization process may be further performed on the second insulation interlayer 118. In this case, although not illustrated in the figures, the second insulation interlayer 118 may be planarized until an upper surface of the dummy pattern 114a is exposed.

Figure 18:
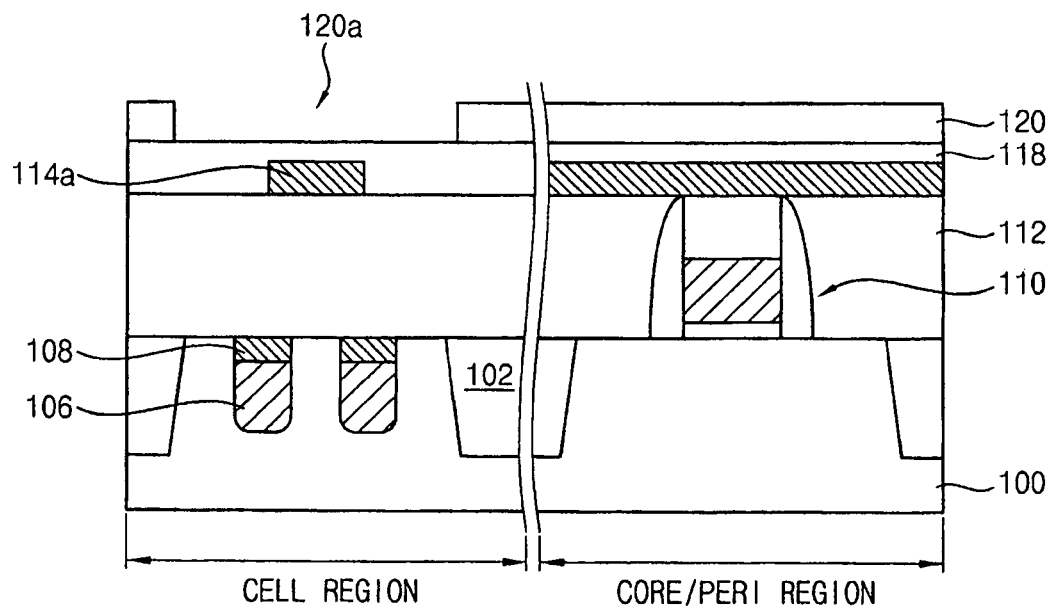

Referring to FIG. 18, a second photoresist pattern 120 is formed on the second insulation interlayer 118. The second photoresist pattern 120 has an exposed portion 120a corresponding to at least one portion of the dummy pattern 114a in the cell region.

Figure 23:
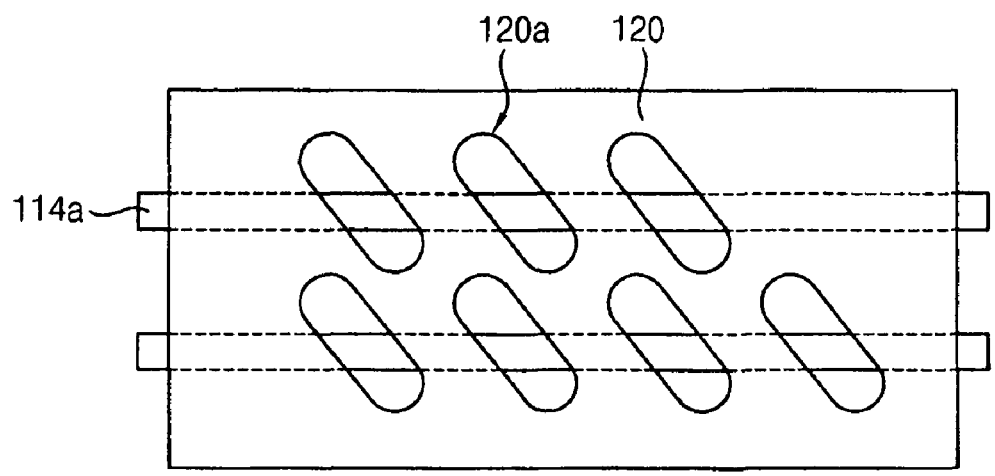
FIG. 23 is a plan view illustrating an example embodiment of a second photoresist pattern formed in a cell region.

FIG. 23 is a plan view illustrating of an embodiment of a second photoresist pattern formed in a cell region.

Referring to FIG. 23, the exposed portion 120a of the second photoresist pattern 120 has an isolated shape, i.e., a shape where at least two portions are not directly adjacent. The dummy pattern 114a under the second photoresist pattern 120 may be arranged to cross over the middle of the exposed portion 120a.

In this embodiment, the exposed portion 120a of the second photoresist pattern 120 may have substantially the same shape as the active region (103, see FIG. 21), and may be positioned to correspond to the active region 103. Accordingly, portions positioned on both sides of the dummy pattern 114a at the exposed portion 120a of the second photoresist pattern 120 may correspond to the storage node contact regions of the cell region.

Figure 19:
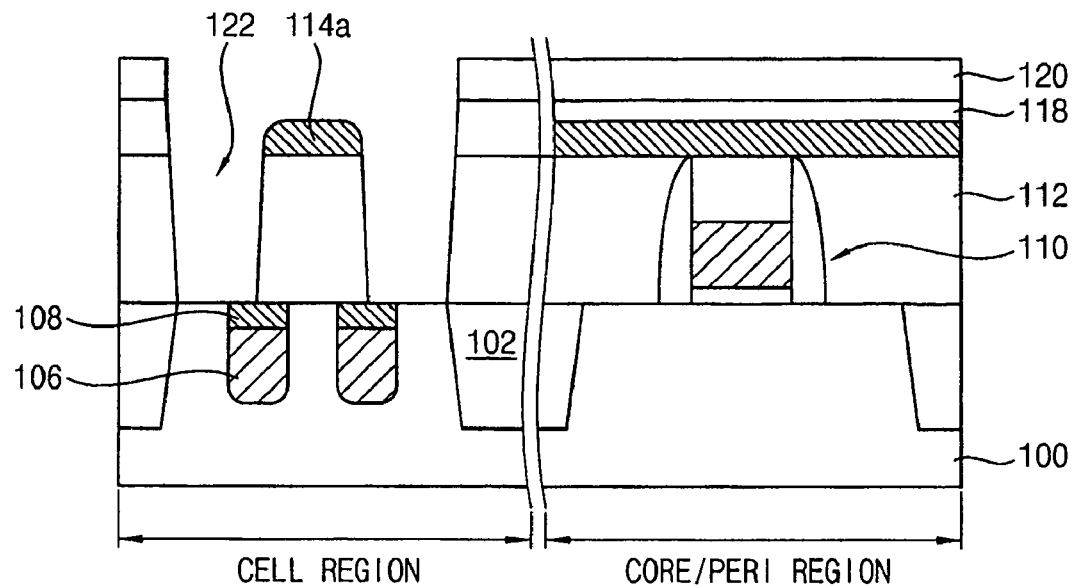

Referring to FIG. 19, the second insulation interlayer 118 is anisotropically etched using the second photoresist pattern 120 as an etching mask, and then the first insulation interlayer is anisotropically etched. Accordingly, two separate contact holes 122 are formed on both sides of the dummy pattern 114a. The storage node contact region is exposed through the contact hole 122.

Figure 20:
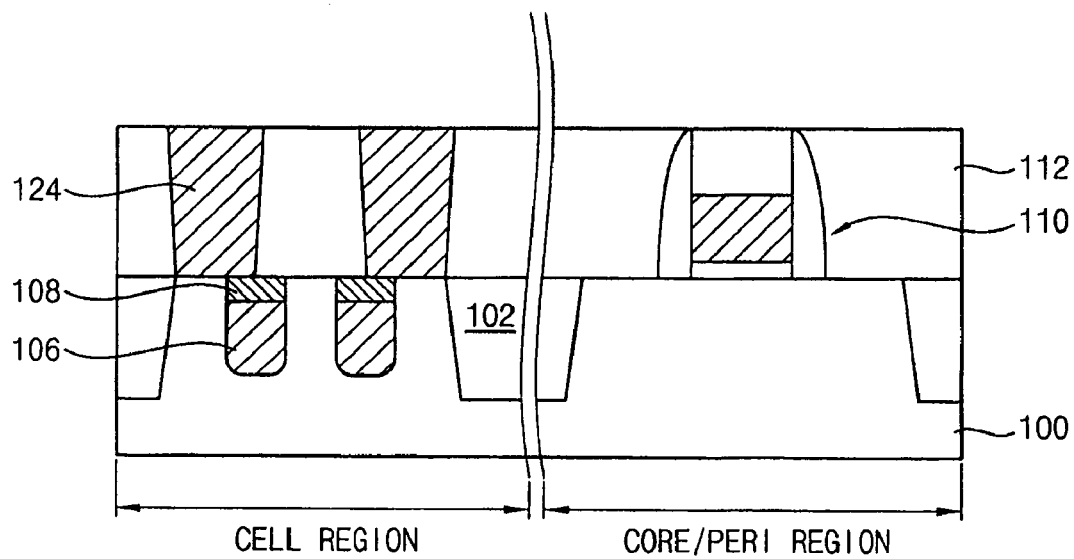

Referring to FIG. 20, the second photoresist pattern 120 is removed from the substrate 100 by ashing and stripping processes.

A conductive layer (not illustrated) is deposited to fill the contact holes 122. The conductive layer may be a metal layer or a doped silicon layer. The conductive layer and the dummy pattern 114a are planarized until the upper surface of the first insulation interlayer 112 is exposed, to form storage node pad contacts 124.

Figure 24:
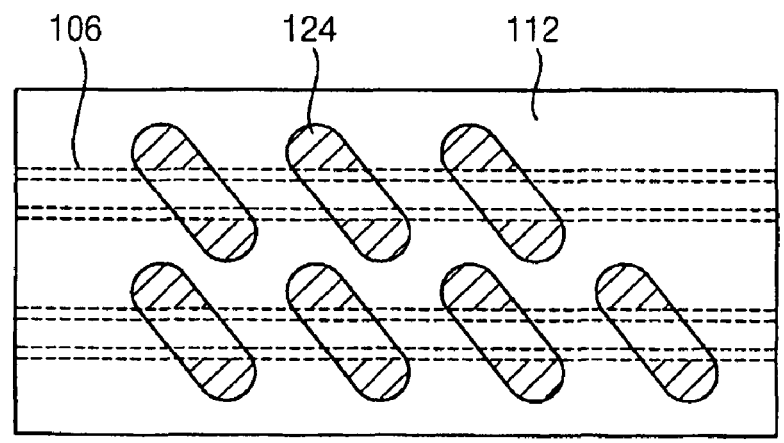
FIG. 24 is a plan view illustrating an example embodiment of storage node pad contacts formed in a cell region.

FIG. 24 is a plan view illustrating an embodiment of storage node pad contacts formed in a cell region.

Referring to FIG. 24, the storage node pad contacts 124 are connected to the drain regions of the buried transistor.

Then, although not illustrated in the figures, a bit line contact and a bit line are formed to be connected to the substrate, and a storage node contact and a storage node are formed to be connected to the storage pad contact, to complete a DRAM device.

As mentioned above, the storage node pad contact may reduce the height of the storage node contact to be formed by a following process. Further, the storage node pad contact may be formed to have a width smaller than that of the exposed portion of the photoresist pattern that is formed by a photolithography process.

Embodiment V

FIGS. 25 to 29 are cross-sectional views illustrating an example embodiment of a DRAM device in accordance with a fifth aspect of the invention.

First, the same processes as explained with reference to FIG. 15 are performed on the substrate 100 to form an isolation pattern 102, a buried gate electrode 106, a capping layer pattern 108 and a planar gate electrode 110 on the substrate 100.

Figure 25:
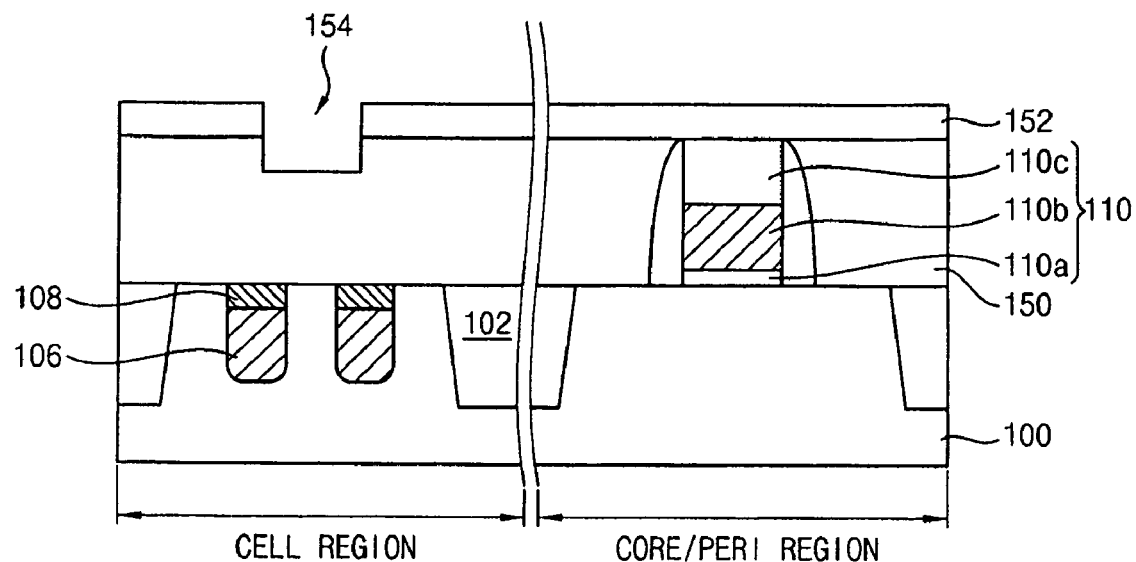
FIGS. 25 to 29 are cross-sectional views illustrating an example embodiment of a DRAM device in accordance with a fifth aspect of the invention.

Referring to FIG. 25, after a first insulation interlayer 150 is formed to cover the planar gate electrode, the first insulation interlayer 150 is planarized by a CMP process. In this case, the first insulation interlayer 150 may be planarized until an upper surface of a hard mask pattern 110c included in the planar gate electrode is exposed. Alternatively, the first insulation interlayer 150 may be planarized not to expose an upper surface of the planar gate electrode 110.

A first photoresist pattern 152 is formed on the first insulation interlayer 150. The first photoresist pattern 152 is formed to expose a portion between contact holes to be formed in the cell region. In this embodiment, the first photoresist pattern 152 may be positioned to expose a portion between the storage node contact regions, that is, a portion facing a bit line contact region. The exposed portion of the first photoresist pattern 152 may have a linear shape extending in the first direction where the buried gate electrode extends. The first photoresist pattern 152 may be formed to cover the entire first insulation interlayer 112 in the core/peripheral region.

The first insulation interlayer 112 is partially etched using the first photoresist pattern 152 as an etching mask to form a trench 154 for molding a dummy pattern. The trench 154 extends in the first direction. After forming the trench 154, the first photoresist pattern 152 is removed from the substrate 100 by ashing and stripping processes.

Figure 26:
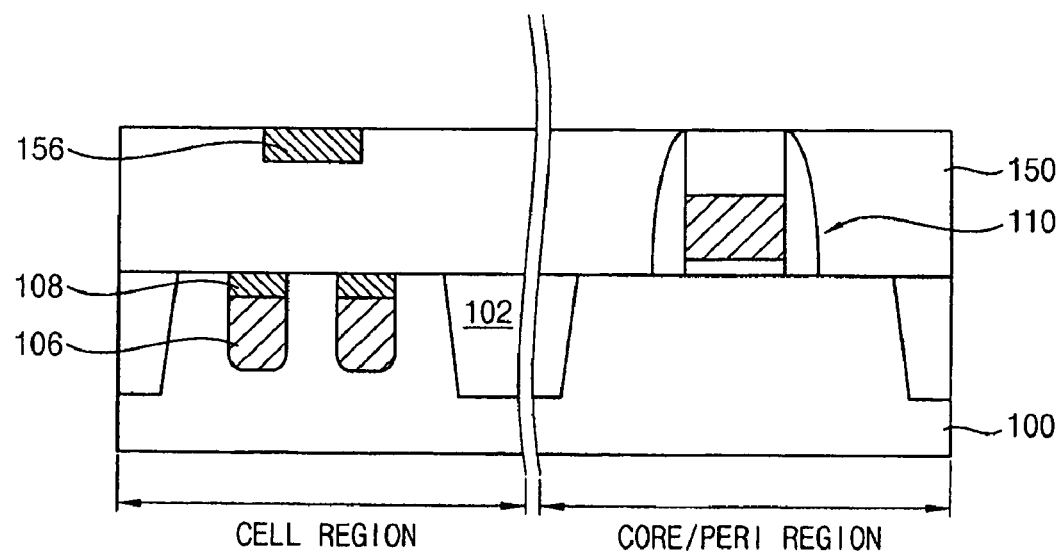

Referring to FIG. 26, a dummy layer (not illustrated) is formed on the first insulation interlayer 150 to fill the trench 154. The dummy layer may include a material having an etch selectivity with respect to the first insulation interlayer 150. For example, the dummy layer may be formed using silicon nitride, polysilicon, etc.

The dummy layer may be planarized by a CMP process until the upper surface of the first insulation interlayer 150 is exposed, to form a dummy pattern 156 in the trench 154. The dummy pattern 156 may have substantially the same shape as illustrated in FIG. 22.

Figure 27:
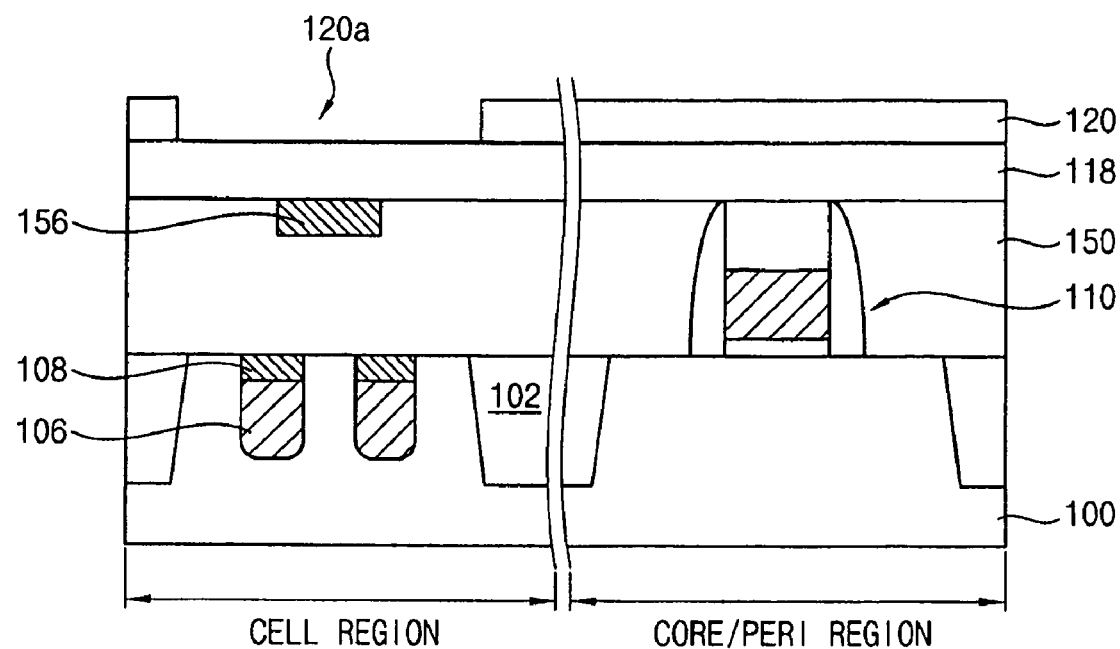

Referring to FIG. 27, a second insulation interlayer 118 is formed to cover the first insulation interlayer 150 and the dummy pattern 156. In this case, because an upper surface of the first insulation interlayer 150 has substantially the same height as that of the dummy pattern 156, a process for planarizing an upper surface of the second insulation interlayer 118 may not be required.

A second photoresist pattern 120 is formed on the second insulation interlayer 118. The second photoresist pattern 120 has an exposed portion 120a for exposing a portion of the second insulation interlayer 118 facing at least one portion of the dummy pattern of the cell region. The exposed portion 120a of the second photoresist pattern 120 may have substantially the same shape as the active region, similar to Embodiment IV. Portions on both sides of the dummy pattern 156 face the storage node contact regions of the cell region.

Figure 28:
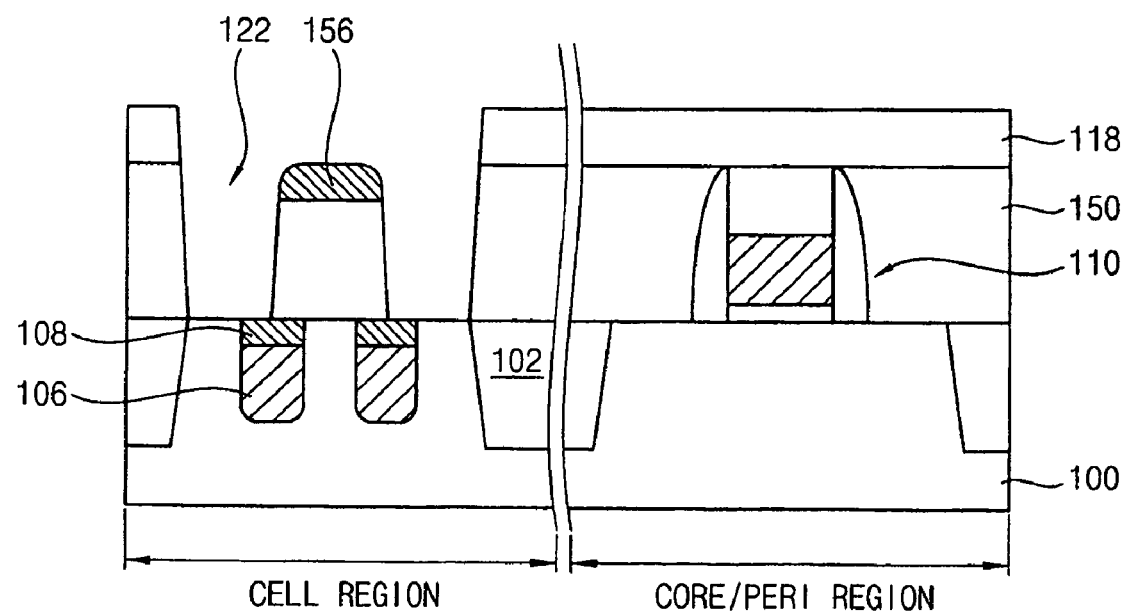

Referring to FIG. 28, the second insulation interlayer 118 is anisotropically etched using the second photoresist pattern 120 as an etching mask, and then the first insulation interlayer 150 is anisotropically etched. Accordingly, two separate contact holes 122 may be formed on both sides of the dummy pattern 156. The storage node contact region is exposed through the contact hole 122.

The second photoresist pattern 120 is removed from the substrate 100 by ashing and stripping processes.

Figure 29:
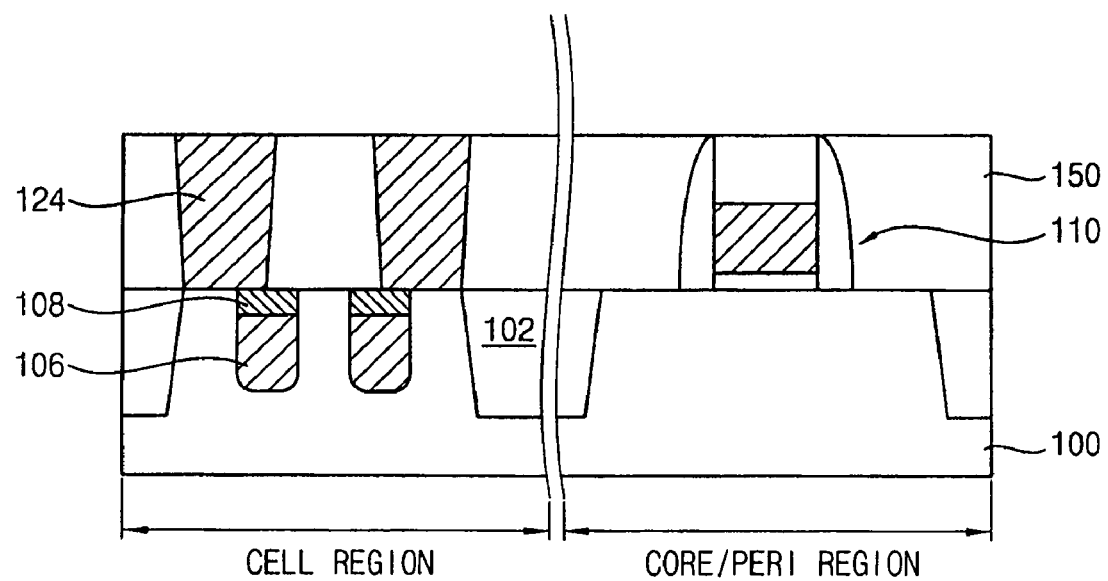

Referring to FIG. 29, a conductive layer (not illustrated) is deposited to fill the contact holes 122. The conductive layer may be a metal layer or a doped polysilicon layer. The conductive layer and the dummy pattern are planarized until the upper surface of the first insulation interlayer 150 is exposed, to form storage node pad contacts 124.

Accordingly, as illustrated in FIG. 24, the storage node pad contacts are formed in the cell region.

Then, although not illustrated in the figures, a bit line contact and a bit line are formed to be connected to the substrate, and a storage node contact and a storage node are formed to be connected to the storage pad contact, to complete a DRAM device.

Embodiment VI

FIGS. 30 to 33 are cross-sectional views illustrating an example embodiment of a DRAM device in accordance with a sixth aspect of the invention.

First, the same processes as explained with reference to FIG. 15 are performed on the substrate 100 to form an isolation pattern 102, a buried gate electrode 106, and a planar gate electrode 110 on the substrate 100.

Figure 30:
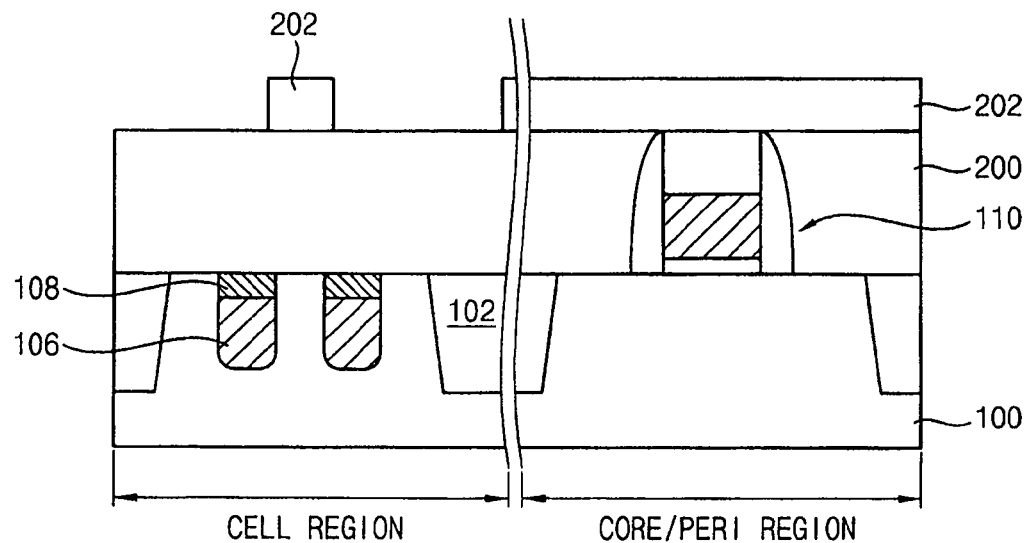
FIGS. 30 to 33 are cross-sectional views illustrating an example embodiment of a DRAM device in accordance with a sixth aspect of the invention.

Referring to FIG. 30, after a first insulation interlayer 200 is formed to cover the planar gate electrode 110, the first insulation interlayer 200 may be planarized by a CMP process. In this case, the first insulation interlayer 200 may be planarized until an upper surface of a hard mask pattern on the planar gate electrode is exposed. Alternatively, the first insulation interlayer 200 may be planarized not to expose the upper surface of the hard mask pattern.

An insulation layer is formed on the first insulation interlayer 200 and is patterned to form an insulation layer pattern 202. The insulation layer pattern 202 may be formed of the same material as the first insulation interlayer 200. The insulation layer pattern 202 may be formed to mask the middle contact-forming region of three contact-forming regions adjacent to one another, that is, a bit line contact pad region. By a following process, one contact plug is formed corresponding to a region where the insulation layer pattern 202 is formed. The insulation layer pattern 202 may have a linear shape extending in the first direction.

As illustrated in FIG. 30, the insulation layer is formed to cover the first insulation interlayer 200 in the core/peripheral region. Alternatively, the insulation layer may be removed from the first insulation interlayer 200 in the core/peripheral region.

Figure 31:
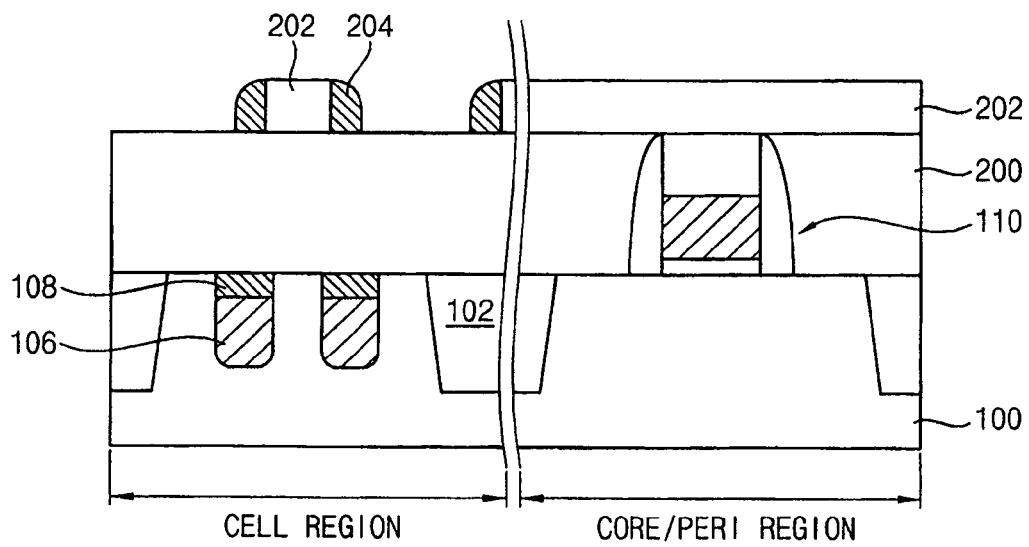

Referring to FIG. 31, a dummy layer (not illustrated) is formed along surfaces of the insulation layer pattern 202 and the first insulation interlayer 200. The dummy layer may include a material having an etch selectivity with respect to the insulation layer pattern and the first insulation interlayer. The dummy layer may have a thickness substantially the same as a width between of the three adjacent contact-forming regions.

The dummy layer is anisotropically etched to form a spacer-shaped dummy pattern 204 on sidewalls of the insulation layer pattern 202. The dummy pattern 204 is formed to mask at least a portion of the buried gate electrode 106.

Figure 34:
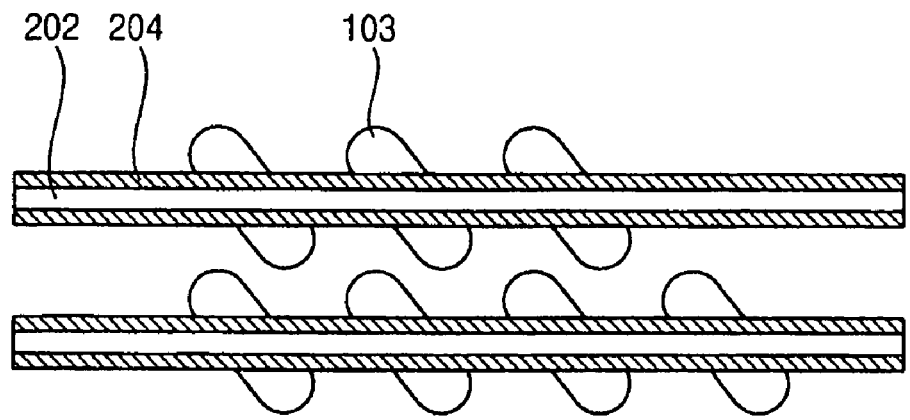
FIG. 34 is a plan view illustrating a dummy pattern formed in a cell region.

FIG. 34 is a plan view illustrating an embodiment of a dummy pattern formed in a cell region.

Referring to FIG. 34, the dummy pattern 204 may have a linear shape crossing over between the storage node contact region and the bit line contact region. The one dummy pattern 204 may be formed to cover the one buried gate electrode under the surface of the substrate.

Figure 32:
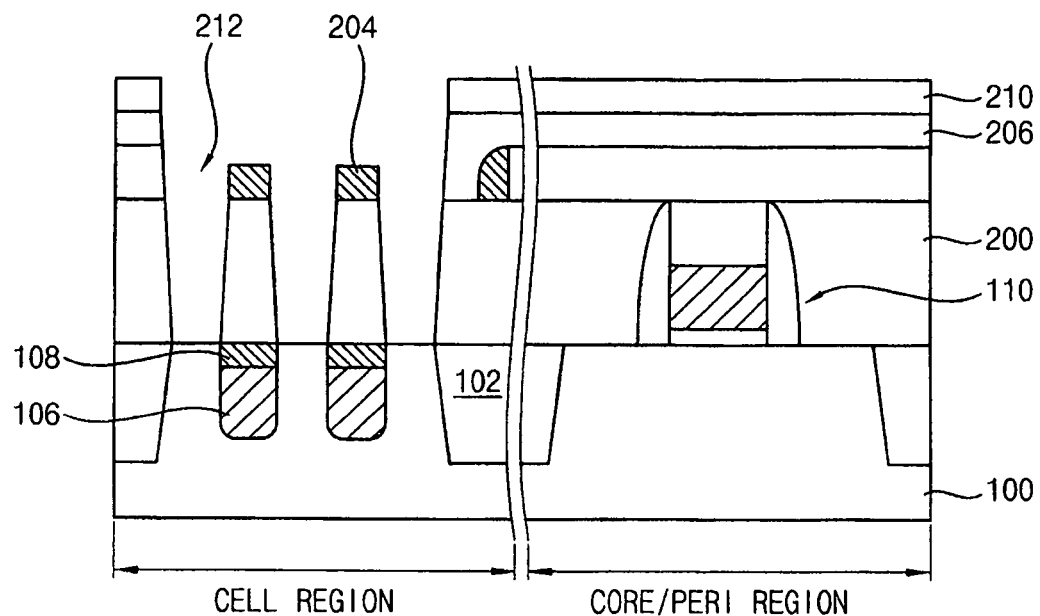

Referring to FIG. 32, a second insulation interlayer 206 is formed to sufficiently cover the dummy patterns 204. A planarization process may be further performed on the second insulation interlayer 206 to planarize an upper surface of the second insulation interlayer 206.

A second photoresist pattern 210 is formed on the second insulation interlayer 206 to expose at least portions of the dummy patterns 204. The second photoresist pattern 210 is formed to expose a portion of the second insulation interlayer 206 corresponding to the storage node contact region and the bit line contact region. The storage node contact region and the bit line contact region are defined by the dummy patterns 204, respectively.

In this embodiment, the exposed portion of the second photoresist pattern 210 may have substantially the same shape as the active region, and is positioned to correspond to the active region.

The second insulation interlayer 206 is anisotropically etched using the second photoresist pattern 210 as an etching mask, and then the first insulation interlayer 200 is anisotropically etched. Accordingly, three separate contact holes 212 are formed on both sides of the dummy patterns 204. The storage node contact region and the bit line contact region are respectively exposed though the contact holes 212.

Figure 33:
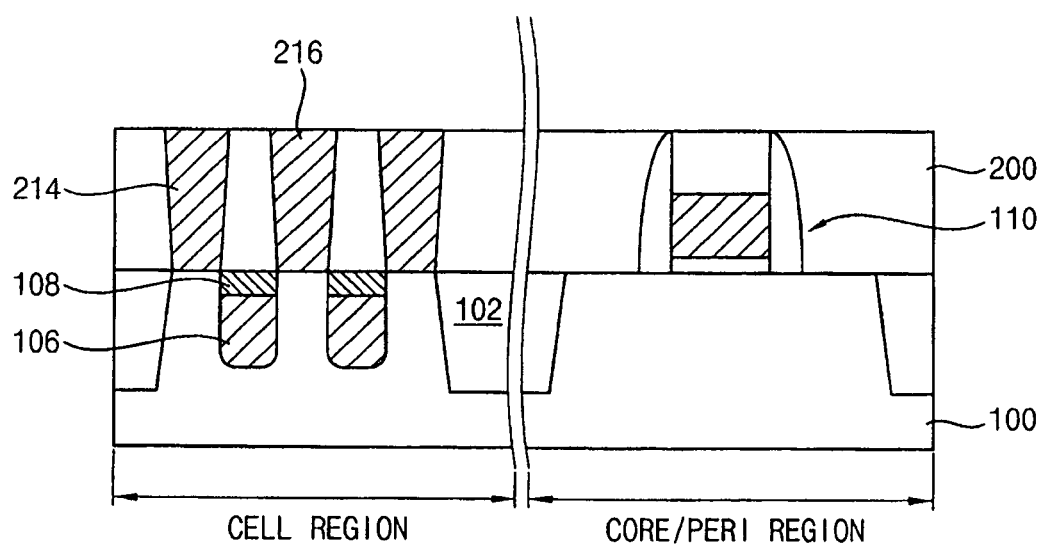

Referring to FIG. 33, the second photoresist pattern 210 is removed from the substrate 100 by ashing and stripping processes.

A conductive layer (not illustrated) is deposited to fill the contact holes 212. The conductive layer may be a metal layer or a doped polysilicon layer. The conductive layer and the dummy pattern are planarized until the upper surface of the first insulation interlayer 200 is exposed, to form storage node pad contacts 214 and a bit line pad contact 216.

Figure 35:
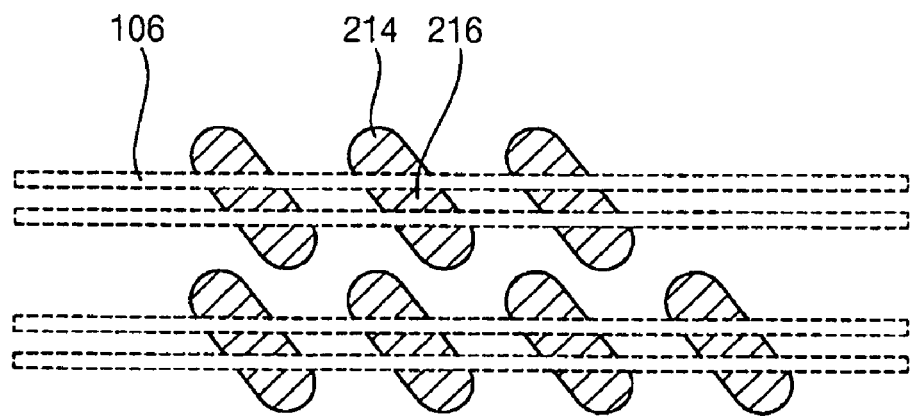
FIG. 35 is a plan view illustrating an example embodiment of a storage node pad contact and a bit line pad contact.

FIG. 35 is a plan view illustrating an embodiment of a storage node pad contact and a bit line pad contact.

Referring to FIG. 35, the storage node pad contact 214 and the bit line pad contact 216 are formed on both sides of the buried gate electrode 106.

Then, although not illustrated in the figures, a bit line contact and a bit line are formed to be connected to the substrate, and a storage node contact and a storage node are formed to be connected to the storage node pad contact, to complete a DRAM device.

As mentioned above, according to some example embodiments, contact holes may be formed to have a width smaller than that of a photoresist pattern formed by a photolithography process, to thereby form a contact having a relatively narrow width. Accordingly, the above-mentioned method may be variously employed to form the contact included in a semiconductor device.

The foregoing describes illustrative example embodiments and is not to be construed as limiting of the present invention. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a contact hole, comprising:
    forming a first insulation interlayer on a substrate;
    forming a dummy pattern on the first insulation interlayer;
    forming a second insulation interlayer to cover the dummy pattern;
    forming a photoresist pattern on the second insulation interlayer, the photoresist pattern having at least one isolated exposed portion, and the dummy pattern under the photoresist pattern being arranged to cross over the exposed portion of the photoresist pattern such that the one isolated exposed portion of the photoresist pattern is divided into two separate parts by the dummy pattern formed under the photoresist pattern; and
    etching the first and second insulation interlayers using the photoresist pattern and the dummy pattern as an etching mask, to form at least two separate contact holes on both sides of the dummy pattern under the one isolated pattern of the photoresist pattern.

2. The method of claim 1, wherein the dummy pattern has a linear shape extending in a first direction.

3. The method of claim 1, wherein the exposed portion of the photoresist pattern has an isolated shape, and a longitudinal direction of the exposed portion is different from a direction in which the dummy pattern is extended.

4. The method of claim 1, wherein a plurality of the dummy patterns is provided on the substrate and the dummy patterns are arranged to be parallel with one another.

5. The method of claim 4, wherein dummy patterns from the plurality of the dummy patterns are arranged in the exposed portions of the photoresist pattern.

6. The method of claim 1, wherein the at least one exposed portion of the photoresist pattern includes a plurality of exposed portions repeatedly arranged.

7. The method of claim 1, wherein forming the dummy pattern comprises:
    forming a dummy layer having an etch selectivity with respect to the first and the second insulation interlayers; and
    patterning the dummy layer.

8. The method of claim 1, wherein forming the dummy pattern comprises:
    partially etching the first insulation interlayer to form a trench;
    forming a dummy layer to fill the trench; and
    planarizing the dummy layer to form the dummy pattern in the trench.

9. The method of claim 1, wherein forming the dummy pattern comprises:
    forming an insulation layer pattern on the first insulation interlayer;
    forming a dummy layer on surfaces of the insulation layer pattern and the first insulation interlayer, the dummy layer having an etch selectivity with respect to the first and the second insulation interlayers; and
    anisotropically etching the dummy layer to form the dummy pattern having a spacer shape on both sides of the insulation layer pattern.

10. A method of manufacturing a semiconductor device, comprising:
    forming buried gate electrodes having contact-forming regions in surfaces of a substrate on both sides of the buried gate electrode, the buried gate electrode being buried in the substrate;
    forming a first insulation interlayer on the substrate;
    forming a dummy pattern on the first insulation interlayer, the dummy pattern being arranged to correspond to a portion between the contact-forming regions;
    forming a second insulation interlayer to cover the dummy pattern;
    forming a photoresist pattern on the second insulation interlayer, the photoresist pattern having an isolated exposed portion to expose the contact-forming regions, the dummy pattern under the photoresist pattern being arranged to cross over the exposed portion of the photoresist pattern such that the one isolated exposed portion of the photoresist pattern is divided into two separate parts by the dummy pattern formed under the photoresist pattern;
    etching the first and second insulation interlayers using the photoresist pattern and the dummy pattern as an etching mask, to form at least two separate contact holes in both sides of the dummy pattern under the one isolated pattern of the photoresist pattern; and
    filling the contact holes with conductive material to form pad contacts.

11. The method of claim 10, further comprising forming planar gate electrodes in a region of the substrate.

12. The method of claim 11, wherein an upper surface of the first insulation interlayer is in the same plane as an upper surface of the planar gate electrode, or the upper surface of the first insulation interlayer has a height greater than that of the upper surface of the planar gate electrode.

13. The method of claim 10, wherein forming the pad contacts comprises:
depositing a conductive layer to fill the contact holes; and
planarizing the conductive layer until the dummy pattern is removed, to form the pad contact in each of the contact holes.

14. The method of claim 10, wherein the dummy pattern is arranged to cover at least two buried gate electrodes.

15. The method of claim 14, wherein the contact-forming region comprises storage node contact regions on both sides of the buried gate electrode, and the pad contact comprises a storage node pad contact.

16. The method of claim 10, wherein the dummy pattern is arranged to cover one of the buried gate electrodes.

17. The method of claim 16, wherein the contact-forming region comprises a storage node contact region and a bit line node contact region on both sides of the buried gate electrode, and the pad contact comprises a storage node pad contact and a bit line pad contact.

18. The method of claim 10, further comprising:
etching an isolation region of the substrate to form an isolation trench to define an active region; and
forming an isolation pattern in the isolation trench.

19. The method of claim 18, wherein the exposed portion of the photoresist pattern is formed to have substantially the same shape as the active region where the buried electrode is formed.

20. The method of claim 10, wherein forming the dummy pattern comprises:
forming a dummy layer having an etch selectivity with respect to the first and the second insulation interlayers; and
patterning the dummy layer.

21. The method of claim 10, wherein forming the dummy pattern comprises:
partially etching the first insulation interlayer to form a trench;
forming a dummy layer to fill the trench; and
planarizing the dummy layer to form the dummy pattern in the trench.

22. The method of claim 10, wherein forming the dummy pattern comprises:
forming an insulation layer pattern on the first insulation interlayer;
forming a dummy layer on surfaces of the insulation layer pattern and the first insulation interlayer, the dummy layer having an etch selectivity with respect to the first and the second insulation interlayers; and
anisotropically etching the dummy layer to form the dummy pattern having a spacer shape on both sides of the insulation layer pattern.

* * * * *